United States Patent
Marks

(10) Patent No.: US 6,639,148 B2
(45) Date of Patent: Oct. 28, 2003

(54) EXTENDIBLE DRAIN MEMBERS FOR GROUNDING RFI/EMI SHIELDING

(75) Inventor: Philip E. Marks, Glenmoore, PA (US)

(73) Assignee: Federal-Mogul Systems Protection Group, Inc., Exton, PA (US)

( * ) Notice: Subject to any disclaimer, the term of this patent is extended or adjusted under 35 U.S.C. 154(b) by 0 days.

(21) Appl. No.: 09/993,155

(22) Filed: Nov. 14, 2001

(65) Prior Publication Data

US 2002/0195260 A1 Dec. 26, 2002

Related U.S. Application Data

(60) Provisional application No. 60/299,656, filed on Jun. 20, 2001.

(51) Int. Cl.[7] .............................. H01B 7/34; H01B 7/00
(52) U.S. Cl. ...................................... 174/36; 174/117 M
(58) Field of Search .............................. 174/36, 117 F, 174/117 M, DIG. 11; 428/36.1, 36.3, 23, 100

(56) References Cited

U.S. PATENT DOCUMENTS

| | | | |
|---|---|---|---|
| 2,032,712 A | | 3/1936 | Morrison et al. ............ 173/264 |
| 3,288,175 A | | 11/1966 | Valko .......................... 139/425 |
| 3,586,597 A | | 6/1971 | Okuhashi ...................... 161/87 |
| 3,986,530 A | | 10/1976 | Maekawa ............... 139/425 R |
| 4,281,211 A | * | 7/1981 | Tatum et al. .................. 174/36 |
| 4,527,135 A | * | 7/1985 | Piper ............................. 333/5 |
| 4,684,762 A | * | 8/1987 | Gladfelter ................ 139/425 R |
| 4,791,236 A | * | 12/1988 | Klein et al. .................. 138/166 |
| 4,804,806 A | * | 2/1989 | Orr. et al. ............... 174/117 M |
| 4,818,820 A | * | 4/1989 | LaRock ........................ 174/36 |
| 4,920,235 A | * | 4/1990 | Yamaguchi ................... 174/36 |
| 5,084,594 A | * | 1/1992 | Cady et al. .................... 174/36 |
| 5,387,113 A | * | 2/1995 | Dickerson et al. ............ 439/98 |
| 5,532,429 A | * | 7/1996 | Dickerson et al. ............ 156/54 |
| 5,673,235 A | * | 9/1997 | Miller .......................... 367/20 |
| 6,328,080 B1 | * | 12/2001 | Winters ....................... 139/388 |

FOREIGN PATENT DOCUMENTS

| WO | WO 00/68958 | * | 4/2000 | ............ H01B/7/00 |
|---|---|---|---|---|
| WO | WO 00/68958 | | 11/2000 | ............ H01B/7/00 |

* cited by examiner

*Primary Examiner*—William H. Mayo, III
(74) *Attorney, Agent, or Firm*—Synnestvedt & Lechner LLP

(57) ABSTRACT

An RFI/EMI shield is formed of interlaced conducting and non-conducting filamentary members. The shield takes the form of a sleeve with a longitudinal seam, the sleeve being biased so that free edges defining the seam are positioned in overlapping relation. A pair of filamentary drain members are positioned adjacent to each other and covered by one of the free edges. One of the drain members is continuously interlaced with the filamentary members forming the sleeve, the other is interlaced at a plurality of attachment regions arranged in spaced relation lengthwise along the sleeve. Between the attachment regions, the drain member floats on the surface of the sleeve and is extendible away from the sleeve for attachment to an electrical ground.

30 Claims, 6 Drawing Sheets

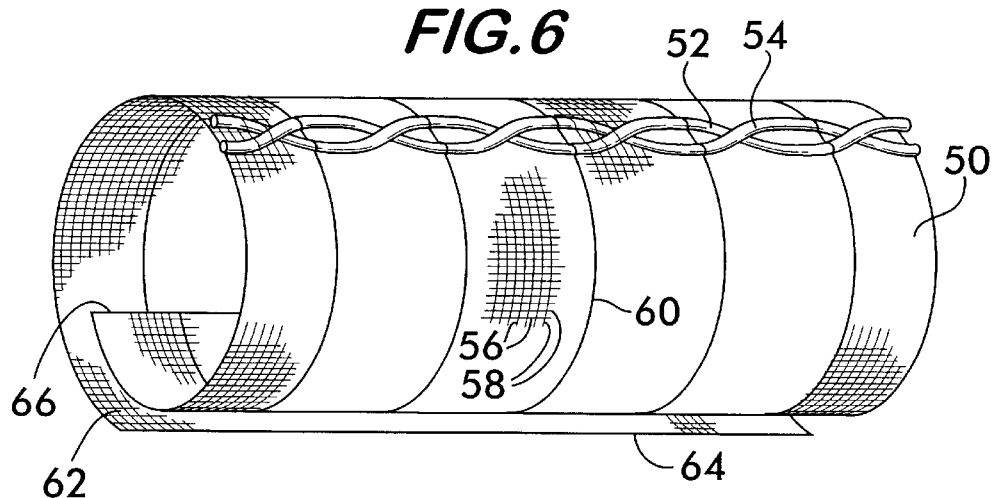
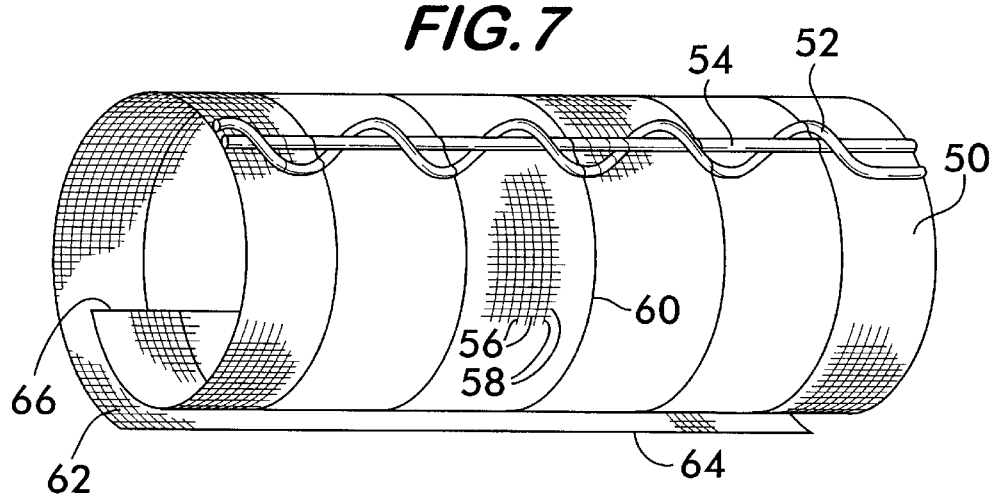
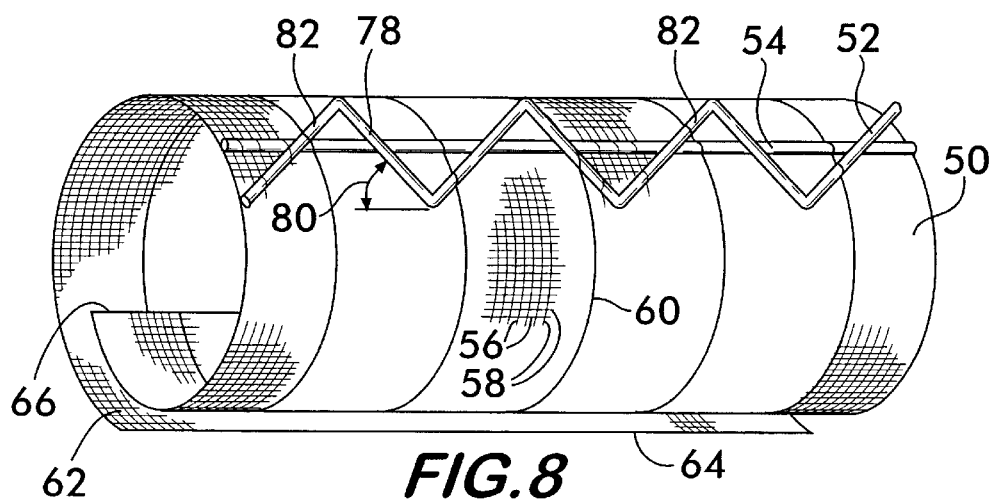

EXTENDIBLE DRAIN MEMBERS FOR GROUNDING RFI/EMI SHIELDING

RELATED APPLICATION

This application is based on and claims priority of U.S. Provisional Application No. 60/299,656, filed Jun. 20, 2001.

FIELD OF THE INVENTION

This invention concerns electrically conducting drain members useable to ground sleeves providing shielding from electromagnetic and radio frequency interference.

BACKGROUND OF THE INVENTION

Electromagnetic interference (EMI) and radio frequency interference (RFI) pose a potential problem preventing the proper functioning of electronic components caused by interference due to inductive coupling between nearby electrical conductors carrying time varying currents or conductors subject to propagating electromagnetic waves. For example, electrical currents in conductors associated with the ignition system or the electrical power system in an automobile may induce spurious signals in various electronic components, such as an electronic module which controls the functioning of the engine or the braking system. Such spurious signals could have disastrous consequences and cause the control modules to malfunction or respond as if the spurious induced signals represented a real condition, potentially causing a loss of control of the vehicle.

Similarly, inductive coupling between electrical wiring and the lines carrying data in a computer network or other communication system may have a corrupting effect on the data being transmitted over the network.

The adverse effects of EMI and RFI are effectively eliminated by proper shielding and grounding of EMI sensitive components. For example, wires carrying control signals which may be subject to unwanted induced interference may be shielded by using a protective sleeve as described in U.S. Pat. No. 4,684,762 to Gladfelter, wherein the sleeve is formed of electrically conductive and non-conductive interlaced yarns (woven, braided or knitted), the conductive yarns being grounded via a drain wire interlaced with the yarns during manufacture of the sleeve, the drain wire being in electrical contact with the conducting yarns.

While such RFI/EMI sleeving is effective at eliminating electrical interference, the sleeving is difficult to properly ground. The sleeve is first cut to a length which is longer than necessary to merely cover the wires to be shielded in order to provide a free length of drain wire for connecting to ground. The free length of drain wire is then formed by cutting away a portion of the sleeve around the drain wire. The sleeve is positioned around the wires to be shielded and the free length of drain wire is connected to ground. This process is wasteful of sleeving and time consuming for the installer, who must cut more sleeve than needed then cut away some of the sleeve without damaging the drain wire to expose it for connection to ground. There is clearly a need for improved RFI/EMI shielding which is less wasteful and may be installed with less effort in a shorter period of time.

SUMMARY AND OBJECTS OF THE INVENTION

The invention concerns a shield for protecting an elongate electrical conductor against radio frequency and electromagnetic interference. In its preferred embodiment, the shield comprises an elongated sleeve having a central space for receiving the conductor. The sleeve is formed of a plurality of flexible and resilient first filamentary members interlaced together. The plurality of first filamentary members includes at least some electrically conducting filamentary members. A pair of filamentary drain members are oriented substantially lengthwise along the sleeve and are interlaced with the first filamentary members. The drain members are flexible, electrically conductive and are in electrical contact with one another and the electrically conducting filamentary members comprising the plurality of first filamentary members. One of the drain members has a lengthwise portion which is extendible away from the sleeve and connectable to an electrical ground for grounding the sleeve.

Preferably, one drain member is interlaced with the first filamentary members at a plurality of discrete regions of attachment arranged in spaced relation lengthwise along the sleeve. The one drain member thus comprises a plurality of segments which float along a surface of the sleeve, one of the segments being positioned between each of the discrete regions of attachment. The one drain member is severable at one of the segments and is thereby extendible away from the sleeve for connection to the electrical ground. The segments of the drain member which float along the surface are preferably longer than the regions of attachment.

The shield according to the invention also comprises a seam extending lengthwise along the sleeve to provide access to the central space. The seam is defined by a pair of free edges which extend lengthwise along the sleeve. Biasing means are located within the sleeve for resiliently biasing the edges into overlapping relation with one another to close the seam. One of the edges is preferably positioned to overlap the other, and the drain members are positioned on the sleeve so as to be covered by the one edge.

Preferably, the drain members comprise stranded copper wire and the first filamentary members are interlaced by weaving, the drain members being interwoven with the first filamentary members. For effective RFI/EMI shielding, the conducting filamentary members comprise between about 10% and about 80% of the sleeve by weight.

It is an object of the invention to provide an RFI/EMI shield which is easily groundable.

It is another object of the invention to provide an RFI/EMI shield in the form of a sleeve adapted for elongate conductors.

It is again another object of the invention to provide an RFI/EMI shield having drain members which are extendible from the shield and attachable to an electrical ground.

These and other objects and advantages of the invention will become apparent upon consideration of the following drawings and description of preferred and alternate embodiments.

BRIEF DESCRIPTION OF THE DRAWINGS

FIGS. 6–8 are perspective views of alternate embodiments of RFI/EMI shields having extendible drain members according to the invention;

DETAILED DESCRIPTION OF THE PRESENTLY PREFERRED EMBODIMENTS

Figures 1, 1A:
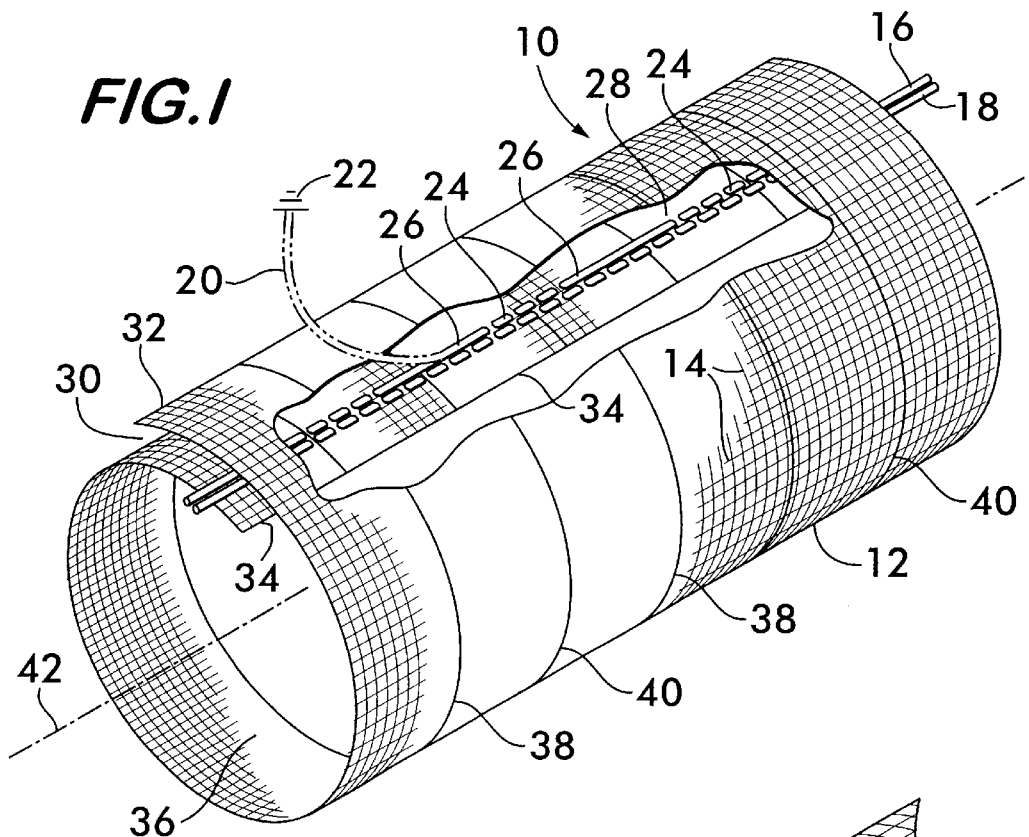
FIG. 1 is a perspective view of a preferred embodiment of an RFI/EMI shield having extendible drain members according to the invention.
FIG. 1A is a perspective view on an enlarged scale of a portion of the shield shown in FIG. 1.

FIG. 1 shows a shield 10 for protecting an elongate electrical conductor against radio frequency and electromagnetic interference. Shield 10 comprises an elongated sleeve 12 formed of a plurality of flexible, resilient filamentary members 14 interlaced together. The term filamentary member as used herein is a generic term for a continuous strand or strands of fibers, filaments, yarns or material in a form suitable for knitting, weaving, braiding or otherwise interlacing to form a structure. Filamentary members include a number of fibers twisted together, a number of fibers laid together without twist, a number of filaments laid or twisted together, as well as a monofilament.

Interlacing of the filamentary members 14 is preferably by weaving but may also be by braiding or knitting. At least some of the filamentary members 14 are electrically conducting. The conducting filamentary members are preferably silver coated nylon monofilaments and the non-conducting filamentary members are preferably twisted bi-component polyester yarns. For effective shielding, it is preferred that the conducting filamentary members comprise between about 10% and about 80% of the sleeve 12 by weight.

A pair of filamentary drain members 16 and 18 are interlaced with the filamentary members 14. Drain members 16 and 18 are electrically conductive and are in electrical contact with one another and with the electrically conducting filamentary members 14. (Drain members 16 and 18 are shown physically separated for clarity in FIG. 1 but they are actually in physical contact in the sleeve 12.) The drain members are preferably made of stranded copper wire for flexibility and tin coated for corrosion resistance. Practical sizes of the drain members may range between 18 gage and 24 gage. A preferred 24 gage drain member is comprised of 19 strands of 36 gage tin coated copper wires twisted together. Other configurations, such as 7 strands of 32 gage wire, are also feasible.

The drain members 16 and 18 are oriented substantially lengthwise along the sleeve, drain member 16 having a lengthwise portion 20 extendible away from the sleeve (shown in phantom line) and connectable to an electrical ground 22 (shown schematically) for grounding the sleeve 12.

In the embodiment shown in FIG. 1, drain member 18 is interlaced with the filamentary members 14 substantially continuously along the length of the sleeve 12, whereas drain member 16 is interlaced with the filamentary members 14 at a plurality of discrete regions of attachment 24 arranged in spaced relation lengthwise along the sleeve. Between the regions of attachment, segments 26 of the drain member 16 float on the surface 28 of the sleeve 12 forming a plurality of portions 20 which are extendible away from the sleeve when the sleeve and the drain members are severed to fit the sleeve to a particular length of elongated conductor to be shielded. For this embodiment, the floating segments 26 are preferably longer than the regions of attachment 24 so that regardless of where the sleeve 12 is severed it is more likely to be severed at a segment 26 between two regions of attachment 24.

In a preferred embodiment of the sleeve shown in FIG. 1A, both drain members 16 and 18 are interlaced with the filamentary members 14 at a plurality of discrete regions 24 arranged in spaced relation lengthwise along the sleeve. Between these regions of attachment, both drain members have segments 26 which float on the surface 28 of the sleeve 12 and form a plurality of portions which can be extended away from the sleeve for attachment to ground. The regions of attachment 24 of drain member 16 are preferably positioned adjacent to the floating segments 26 on drain member 18, and the regions of attachment 24 of drain member 18 are preferably positioned adjacent to the floating segments 26 on drain member 16. This arrangement ensures that a segment 26 will be available for extension from sleeve 12 regardless of where along its length the sleeve is severed.

Preferably, sleeve 12 has a lengthwise extending seam 30 defined by a pair of free edges 32 and 34 also extending lengthwise along the sleeve. Seam 30 provides access to the central space 36 surrounded by sleeve 12 for positioning an elongate conductor within the sleeve. The sleeve has biasing means 38 which resiliently bias edge 32 to overlap edge 34 and nominally close the seam 30 (the seam being readily openable by manually separating edges 32 and 34). Drain members 16 and 18 are positioned on the sleeve 12 so as to be covered by free edge 32 and thereby prevent possible short circuiting against floating segments 26. The preferred position of drain members 16 and 18 is proximate to free edge 34 as shown in FIG. 1.

Biasing means 38 preferably comprises supplementary filamentary members 40 interlaced with the filamentary members 14 and oriented substantially transversely to the long axis 42 of sleeve 12. Supplementary filamentary members 40 are preferably monofilaments comprised of a resiliently settable material, such as a thermoplastic or a metal such as stainless steel or nitinol. Monofilaments comprised of such materials allow the supplementary filamentary members to be resiliently set, for example, in a circular curvature, so as to resiliently bias free edge 32 into overlapping relation with free edge 34.

In use, the preferred embodiment of the shield 10 shown in FIG. 1 is cut to length appropriate for the elongate conductor to be shielded. The edges 32 and 34 are manually separated and the sleeve is positioned around the conductor. A severed portion 20 of a segment 26 is drawn from between the free edges 32 and 34 and is attached to a nearby electrical ground. The segment 26 may be severed as a result of cutting the sleeve to fit the conductor, in which case the severed segment 26 will extend from the sleeve near the cut end of the sleeve. If the sleeve is cut at a region of attachment 24 rather than on a segment 26, the drain member 16 may be slipped out from the cut region of attachment to extend away from the sleeve. It is also possible to sever just a segment 26 and withdraw it from between the edges anywhere along the length of the sleeve for attachment to ground.

Alternate Embodiments

Figure 2:
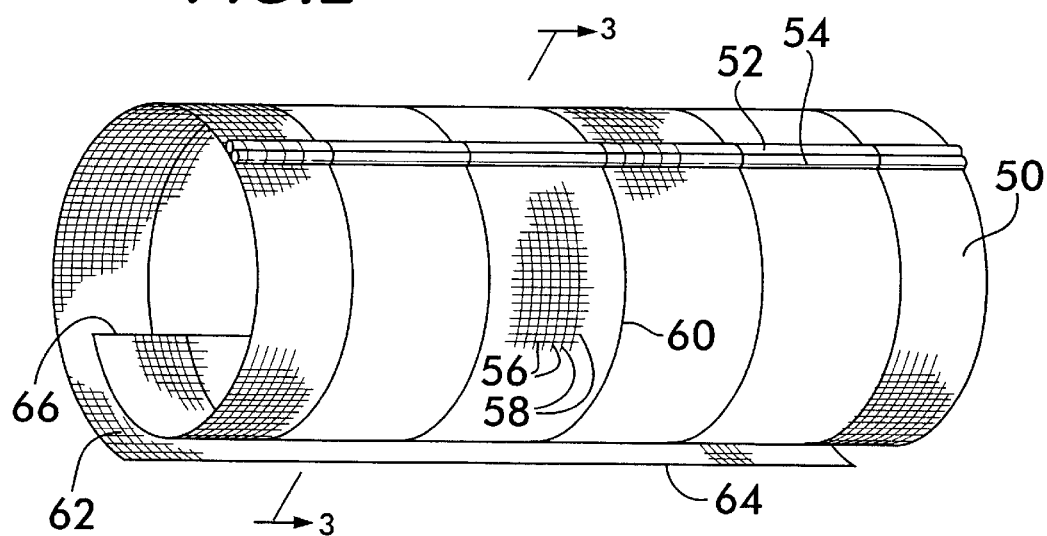
FIG. 2 is a perspective view of an alternate embodiment RFI/EMI shield having extendible drain members according to the invention.

FIG. 2 shows an alternate sleeve embodiment 50 having twin interlaced drain members 52 and 54 according to the invention. Sleeve 50 is preferably of woven construction and comprises both conducting and non-conducting filamentary members 56 and 58 respectively.

Resilient flexible supplementary filamentary members 60 comprised of a material which allows them to be biased or set into a particular shape and resiliently return to that shape are preferably interwoven with filamentary members 56 and 58 to give the sleeve a desired shape and stiffness. The preferred shape is substantially tubular with an open seam 62 arranged lengthwise along the tube and defined by edges 64 and 66 in overlapping relationship. The flexibility of the supplementary filamentary members 60 allows the seam 62 to be temporarily opened by spreading the edges 64 and 66 apart, thereby providing access to the sleeve interior. The resilient bias of the members 60 enables the seam to close with the sleeve edges returning to their overlapping relation with the sleeve resuming its tubular shape upon release of the edges.

In this alternate embodiment, the sleeve 50 is comprised of twisted bi-component yarns with the conductive yarns 56 being silver plated nylon and the non-conductive yarns 58 being polyester. For the woven embodiment, the conductive yarns 56 are in both the warp and fill directions with the warp yarns having a relatively larger percentage of silver plated content than the fill yarns. The resilient supplementary filamentary members 60 are interwoven in the fill direction and are preferably monofilaments comprised of a thermoplastic such as polyester which allows the members 60 to be heat set or biased into the tubular form.

In addition to interlacing the yarns by weaving, the sleeve may also be knitted or braided. Other conductive yarns formed of conductive materials, such as carbon, graphite or conductive polymers, as well as non-conducting yarns with conductive coatings other than silver may also comprise the conductive yarns 56. Effective shielding of RFI/EMI is obtained when the conductive yarns 56 comprise between about 10% and about 80% by weight of the fabric forming the sleeve.

Figure 3:
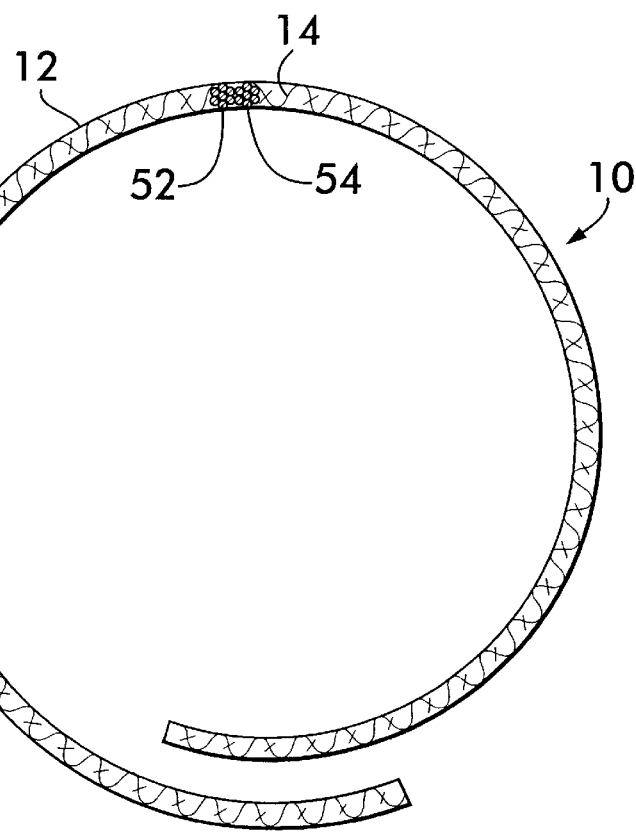
FIG. 3 is a cross-section taken along lines 3—3 of FIG. 2.

Two drain members 52 and 54 are interlaced with the conducting and non-conducting yarns 56 and 58, as well as with the resilient members 60, and in the embodiment shown in FIGS. 2 and 3, are interwoven side by side lengthwise along the sleeve 50. The drain members 52 and 54 are in electrical contact with one another and the conducting yarns 56 in the sleeve substantially along the entire length of the sleeve and therefore provide excellent grounding of the sleeve. Preferably, the drain members are stranded and comprised of copper for increased flexibility and excellent conductivity. The copper strands are preferably tin coated to prevent corrosion and practical sizes of the drain members may range between 18 gage and 24 gage. A preferred 24 gage drain member is comprised of 19 strands of 36 gage tin coated copper wires twisted together. Other configurations, such as 7 strands of 32 gage wire, are also feasible.

Figure 4:
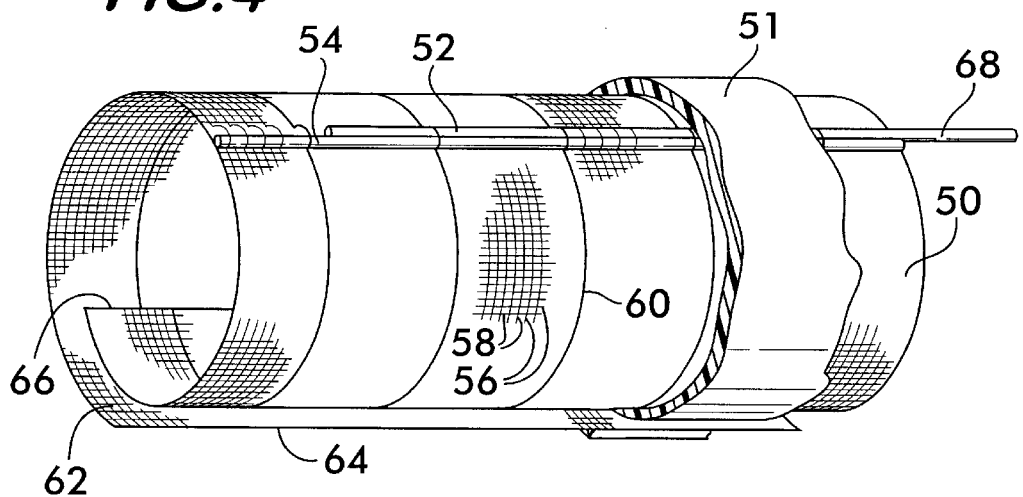
FIG. 4 is a perspective view of the shield shown in FIG. 2 with one of the drain members being shown extending from the shield.

To effect grounding of the sleeve according to the invention, one of the drain members must be connected to ground, for example, to a metal chassis or body part of an automobile or a metal support frame of an electronic housing which may itself be grounded. Such connection is easily made as shown in FIG. 4, wherein one of the drain members 52 is partially drawn out of the sleeve so that a portion 68 extends away from the sleeve. The extended portion 68 may be readily attached to ground by a grounding lug or bolt. Even with a portion of the drain member 52 drawn from the sleeve 10, drain member 54 is still in contact with the sleeve substantially over its entire length and, thus, provides a good conductive path to ground over the entire length of the sleeve.

The sleeve 50 may also have a non-textile covering or coating 51 on the outside (as shown in FIG. 4) or on the inside. The non-textile covering may be made of flexible polymers such as polypropylene, ABS and polyester and provides a layer for electrically insulating the sleeve, waterproofing the sleeve or protecting the sleeve from abrasion or other physical damage.

Figure 5:
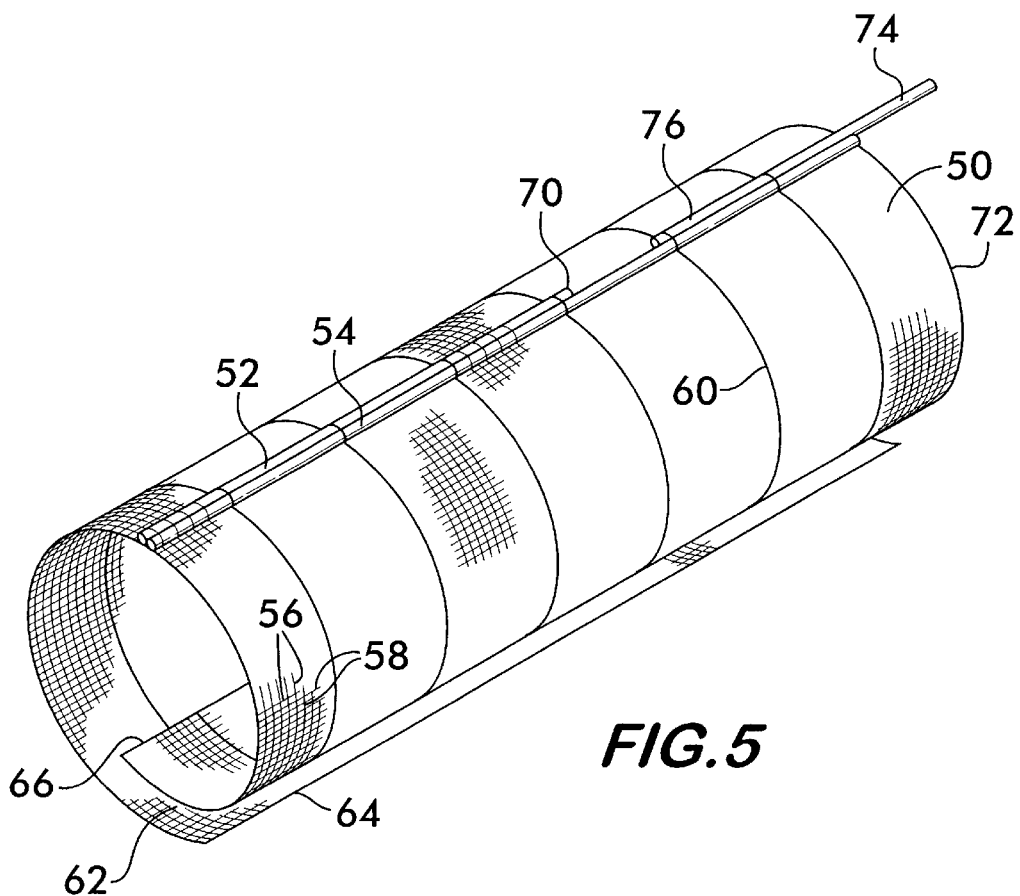
FIG. 5 is a perspective view of the shield shown in FIG. 2 with one of the drain members cut and extended from the shield.

For relatively long lengths of sleeving 50, it may be difficult to withdraw a drain member due to the friction between it and the conductive and nonconductive wires, as well as the resilient members 60 with which it is interlaced. This difficulty is easily remedied as shown in FIG. 5 by cutting the drain member 52 at a position 70 spaced away from the end 72 of the sleeve 50 from which the drain member is to be withdrawn. The position 70 is chosen so that an adequate length of wire 74 may extend from the sleeve and be easily connected to a convenient ground but still leave enough length 76 interlaced with the sleeve to: (1) maintain a good electrical connection with the other drain member 54 and the conductive yarns 56; and (2) maintain a secure physical connection to the sleeve 50 without having the length 76 be so long that friction makes it too difficult to withdraw readily.

FIGS. 6–8 illustrate further alternate embodiments of the sleeve according to the invention wherein the drain members 52 and 54 are configured differently from the presently preferred embodiment.

FIG. 6 shows drain members 52 and 54 twisted together and interlaced with the filamentary members and supplementary members forming the sleeve 50. Twisted wires ensure that contact points will be maintained between the drain members but at some sacrifice of ease of withdrawal of a drain member from the sleeve.

FIG. 7 shows drain member 52 wound helically around drain member 54, which is substantially straight along the length of sleeve 50. With this embodiment, it is considered to be easier to withdraw drain member 54 for connection to ground due to its straightness. Good contact will still be maintained by the helical winding of drain member 52.

FIG. 8 shows drain member 54 again substantially straight along the sleeve 50 with drain member 52 interlaced in a series of interconnected segments 78 which cross over the drain member 54. Each segment 78 of the drain member 52 is oriented at an angle 80 with respect to the drain member 54, the angle of each segment having an opposite slope to the angle of an adjacent segment and the drain member 52, thus, being arranged in a zig-zag pattern along the sleeve and contacting drain member 54 at the cross over points 82.

Figure 9:
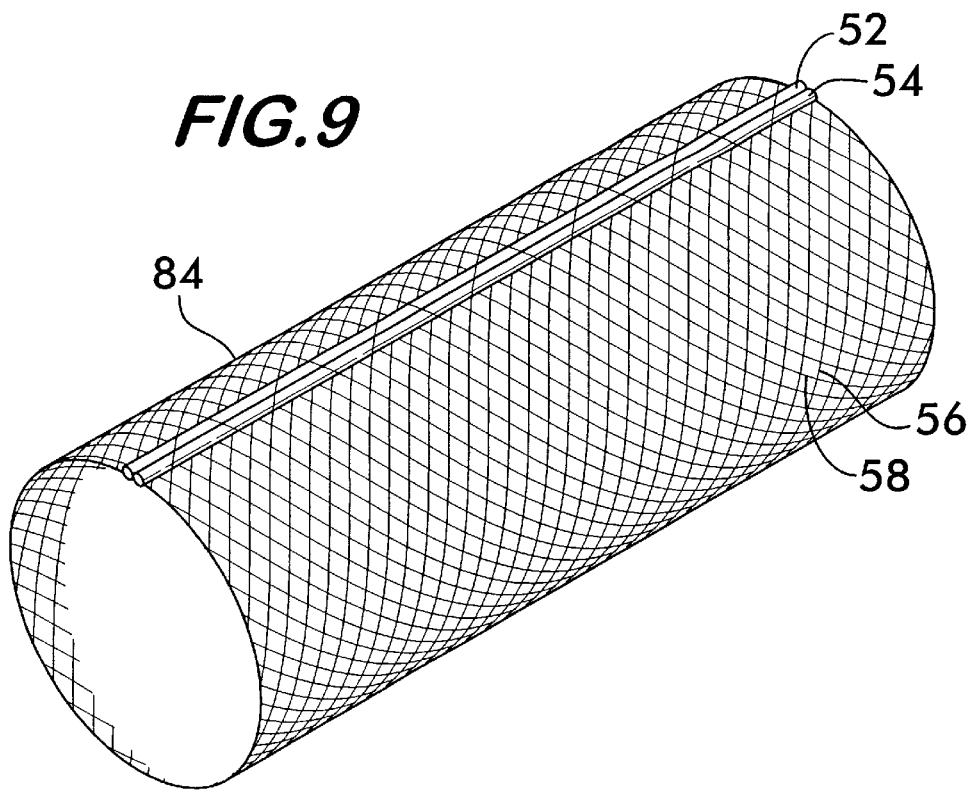
FIG. 9 is a perspective view of an alternate embodiment of the RFI/EMI shield according to the invention which is braided and has no longitudinal seam.

FIG. 9 shows an alternate embodiment, sleeve 84, which does not have an open longitudinal seam. Sleeve 84 may be woven or knitted but is preferably braided of conducting and non-conducing filamentary members 56 and 58 and has drain members 52 and 54 laid into the braid. It is preferred not to interbraid the drain members so that they may be readily placed into contact with each other and the conducting filamentary members 56 comprising the sleeve without disrupting the braid pattern. Laying in of the drain members also enables them to be more easily drawn from the sleeve to effect a grounding connection since the drain members will be substantially straight and bound to the sleeve by fewer cross over points than if they were interbraided, thus, reducing the friction between the sleeve and the drain members. The "trellis effect", associated only with the braided structure, whereby the braided sleeve expands radially when under lengthwise compression and contracts radially when under lengthwise tension, is especially useful for facilitating withdrawal of a laid in drain member. By compressing the sleeve lengthwise, the filamentary members forming the sleeve separate from one another upon the associated radial expansion, loosening their grip on the drain members and allowing them to be easily drawn outwardly. The relative stiffness and straightness of the drain members will also aid them in resisting the compressive force on the sleeve, causing the ends of the drain members to extend from the sleeve when it is compressed, thus, providing convenient purchase for grasping an end, either manually or with a tool.

Figure 10:
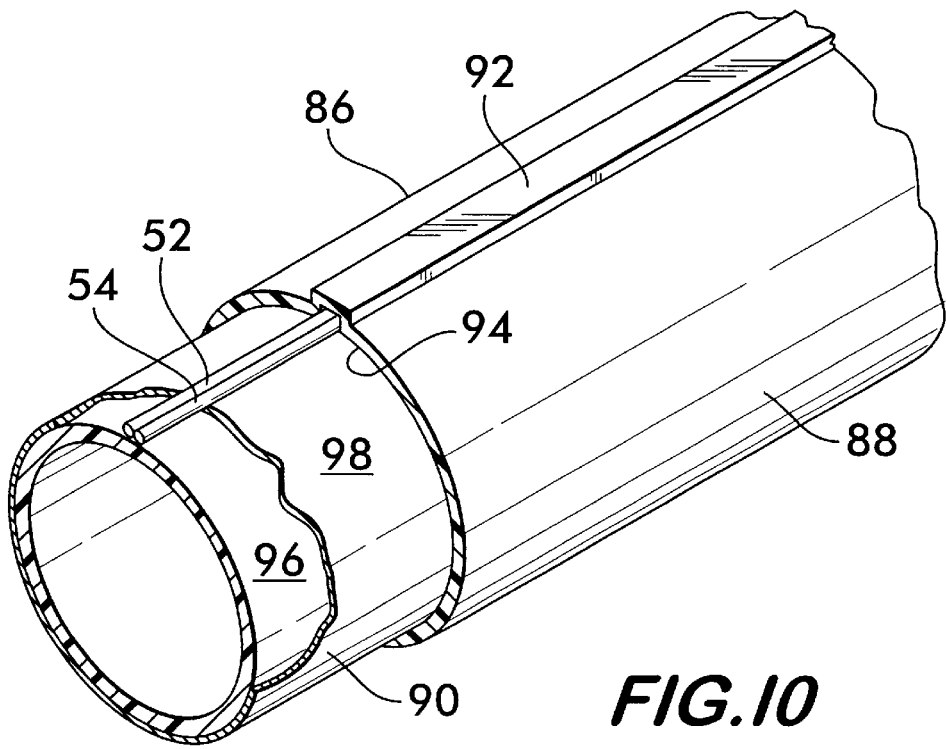
FIG. 10 is a perspective view of an embodiment of the RFI/EMI shield according to the invention not formed by interlaced filamentary members.

The invention also contemplates use of the twin drain member concept with a sleeve embodiment 86 shown in FIG. 10 not formed of interlaced filamentary members. Non-interlaced sleeve 86 is preferably a laminate comprising a plurality of layers and has at least an outer layer 88 and an inner layer 90 between which drain members 52 and 54 are encased. Preferably, the drain members are confined within a channel 92 which keeps them in contact with one another and the interfacing surfaces 94 and 96 of the inner and outer layers respectively. A conductive coating 98 may be positioned on either of the interfacing surfaces 94 or 96 to provide the RFI/EMI shielding (the coating being shown on the surface 96). The drain members are in contact with coating 98 and are slidable within channel 92 and capable of being drawn outwardly from the channel to effect a ground connection.

The non-interlaced sleeve is preferably made of a resilient, flexible polymer such as polyester, polypropylene and ABS, and the conductive coating 98 may be a relatively thin vacuum coated aluminum layer.

Figure 11:
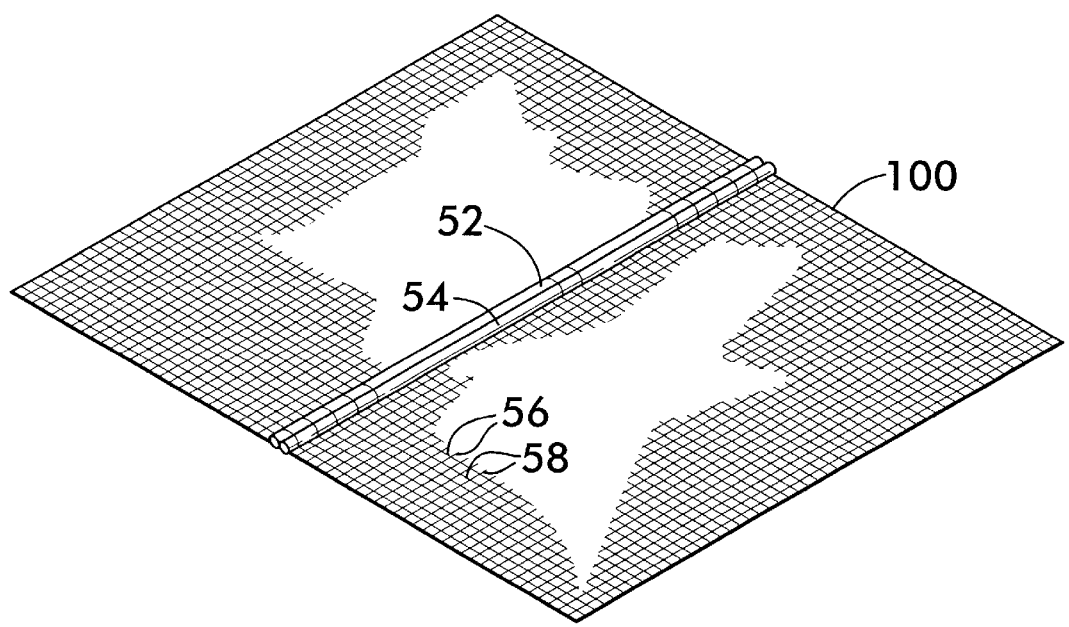
FIG. 11 is a perspective view of drain members used on a flat RFI/EMI shield.

The extendible drain members according to the invention may also be used on flat fabric shielding 100 as shown in FIG. 11, where drain members 52 and 54 are interwoven with conductive and non-conductive filamentary members 56 and 58 forming the shield.

The RFI/EMI sleeving with the extendible drain members according to the invention will provide for more efficient application of RFI/EMI shielding because fewer steps are needed to ground the sleeve since the drain member does not need to be cut out of it, and no sleeving material will be wasted since the sleeve need not be cut to a longer length than necessary to provide for sufficient length of drain member to connect to ground.

What is claimed is:

1. A shield for an elongate electrical conductor, said shield providing protection to said conductor against radio frequency and electromagnetic interference as well as preventing electromagnetic radiation from radiating from said conductor, said shield comprising:

an elongated sleeve having a central space for receiving said conductor, said sleeve comprising a plurality of flexible and resilient first filamentary members interlaced together, said plurality of first filamentary members including at least some electrically conducting filamentary members; and a pair of filamentary drain members oriented substantially lengthwise along said sleeve and interlaced with said first filamentary members, said drain members being flexible, electrically conductive and in electrical contact with one another and said electrically conducting filamentary members comprising said plurality of first filamentary members, one of said drain members having a lengthwise portion extendible away from said sleeve and connectable to an electrical ground for grounding said sleeve.

2. A shield according to claim 1, wherein said one drain member is interlaced with said first filamentary members at a plurality of discrete regions of attachment arranged in spaced relation lengthwise along said sleeve, said one drain member thereby comprising a plurality of segments which float along a surface of said sleeve, one of said segments being positioned between each of said discrete regions of attachment, said one drain member being severable at one of said segments and thereby being extendible away from said sleeve for connection to said electrical ground.

3. A shield according to claim 2, wherein said segments which float along said surface are longer than said regions of attachment.

4. A shield according to claim 2, wherein another of said drain members is interlaced with said first filamentary members at a plurality of other discrete regions of attachment arranged in spaced relation lengthwise along said sleeve, said other drain member thereby comprising a plurality of other segments which float along said surface of said sleeve, one of said other segments being positioned between each of said other discrete regions of attachment, said other drain member being severable at one of said other segments and thereby being extendible away from said sleeve for connection to said electrical ground.

5. A shield according to claim 4, wherein each of said discrete regions of attachment of said one drain member is positioned adjacent to one of said other segments of said other drain member, and each of said other discrete regions of attachment of said other drain member are positioned adjacent to one of said segments of said one drain member.

6. A shield according to claim 2, further comprising:

a seam extending lengthwise along said sleeve providing access to said central space, said seam being defined by a pair of free edges extending lengthwise along said sleeve; and biasing means located within said sleeve for resiliently biasing said edges into overlapping relation with one another to close said seam, one of said edges thereby being positioned to overlap the other, said drain members being positioned to be covered by said one edge.

7. A shield according to claim 6, wherein said biasing means comprises supplementary filamentary members interlaced with said first filamentary members and oriented substantially transversely to the long axis of said sleeve, wherein said biasing means comprises filamentary members of a resiliently settable material, said supplementary filamentary members being resiliently set so as to resiliently bias said edges into said overlapping relation.

8. A shield according to claim 7, wherein said supplementary filamentary members comprise are monofilaments.

9. A shield according to claim 7, wherein said monofilaments are comprised of a thermoplastic material.

10. A shield according to claim 7, wherein said monofilaments comprise metal wire.

11. A shield according to claim 6, wherein said non-conducting filamentary members are comprised of polyester.

12. A shield according to claim 11, wherein said conducting filamentary members comprise silver coated nylon.

13. A shield according to claim 12, wherein said drain members comprise stranded copper wire.

14. A shield according to claim 2, wherein said first filamentary members are interlaced by weaving and said drain members are interwoven with said first filamentary members.

15. A shield according to claim 1, wherein said electrically conducting filamentary members comprise between about 10% and about 80% of said sleeve by weight.

16. A shield according to claim 1, wherein said drain members are interlaced with said first filamentary members in side-by-side contact with one another substantially along the length of said sleeve, said one drain member being slidable lengthwise along said sleeve and extendible from an end thereof away from said sleeve for connection to said electrical ground.

17. A shield according to claim 16, further comprising:
a seam extending lengthwise along said sleeve providing access to said central space, said seam being defined by a pair of free edges extending lengthwise along said sleeve; and
biasing means located within said sleeve for resiliently biasing said edges into overlapping relation with one another to close said seam, one of said edges thereby being positioned to overlap the other, said drain members being positioned to be covered by said one edge.

18. A shield according to claim 17, wherein said filamentary drain members are positioned proximate to said other edge.

19. A shield according to claim 17, wherein said biasing means comprises supplementary filamentary members interlaced with said first filamentary members and oriented substantially transversely to the long axis of said sleeve, said supplementary filamentary members being comprised of a resiliently settable material, said supplementary filamentary members being resiliently set so as to resiliently bias said edges into said overlapping relation.

20. A shield according to claim 16, wherein said first filamentary members are interlaced by braiding and said drain members are laid into said sleeve substantially parallel to the long axis thereof.

21. A shield according to claim 16, wherein said first filamentary members are interlaced by weaving, said sleeve having a warp direction oriented substantially lengthwise along said sleeve, said drain members being interwoven substantially in said warp direction.

22. A shield according to claim 1, wherein said filamentary drain members are twisted around one another substantially along the length of said sleeve to provide electrical contact substantially along their entire length, said one drain member being slidable lengthwise along said sleeve and extendible from an end thereof away from said sleeve for connection to said electrical ground.

23. A shield according to claim 1, wherein said other drain member is helically wound around said one drain member substantially along the length of said sleeve to provide electrical contact substantially along their entire length, said one drain member being slidable lengthwise along said sleeve and extendible from an end thereof away from said sleeve for connection to said electrical ground.

24. A shield according to claim 1, wherein said one drain member is oriented substantially parallel with the long axis of said sleeve and the other drain member comprises a plurality of interconnected segments, each one of which is oriented at a respective angle to said one drain member, said respective angles having opposite slopes for each adjacent segment, said other drain member contacting said one drain member at a plurality of cross over points in spaced relation lengthwise along said sleeve, said one filamentary drain member being slidable lengthwise along said sleeve and extendible from an end thereof away from said sleeve for connection to said electrical ground.

25. A shield for an elongate electrical conductor, said shield providing protection to said conductor against radio frequency and electromagnetic interference as well as preventing electromagnetic radiation from radiating from said conductor, said shield comprising:
a flexible elongated sleeve having a central space for receiving said conductor, said sleeve having an electrically conducting surface surrounding said central space; and
a pair of filamentary drain members oriented substantially lengthwise along said sleeve, said drain members being flexible, electrically conducting and in electrical contact with one another and said electrically conducting surface, one of said drain members having a lengthwise portion extendible away from said sleeve and connectable to an electrical ground for grounding said sleeve.

26. A shield according to claim 25, wherein said sleeve is comprised of a plurality of filamentary members interlaced together, at least some of said filamentary members being electrically conducting and distributed over said sleeve forming said conducting surface, said drain members being interlaced with said filamentary members, one of said drain members being slidable lengthwise along said sleeve and extendible from an end thereof thereby forming said lengthwise portion connectable to an electrical ground for grounding said sleeve.

27. A shield according to claim 25, wherein said flexible elongated sleeve comprises a pair of coaxially mounted first and second sleeve members having interfacing surfaces substantially in contact with each other wherein one of said interfacing surfaces is said conducting surface and said drain members are captured between said interfacing surfaces, one of said drain members being slidable lengthwise along said sleeve between said interfacing surfaces and extendible from an end of said sleeve thereby forming said lengthwise portion connectable to an electrical ground for grounding said sleeve.

28. A shield according to claim 27, wherein said coaxially mounted sleeve members are comprised of substantially continuous plastic membranes.

29. A shield according to claim 28, wherein said conducting surface comprises a metallic coating positioned on one of said interfacing surfaces.

30. A shield according to claim 29, wherein said conducting surface comprises a metal foil.

* * * * *